US008441135B2

(12) United States Patent
Yoko et al.

(10) Patent No.: US 8,441,135 B2
(45) Date of Patent: May 14, 2013

(54) SEMICONDUCTOR DEVICE

(75) Inventors: Hideyuki Yoko, Tokyo (JP); Kayoko Shibata, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 13/563,650

(22) Filed: Jul. 31, 2012

(65) Prior Publication Data

US 2012/0305917 A1 Dec. 6, 2012

Related U.S. Application Data

(63) Continuation of application No. 12/923,787, filed on Oct. 7, 2010.

(30) Foreign Application Priority Data

Oct. 9, 2009 (JP) ................................ 2009-235490

(51) Int. Cl.
*H01L 23/48* (2006.01)
(52) U.S. Cl.
USPC ........ 257/777; 257/E27.11; 257/48; 257/774; 257/E23.011; 257/E23.02
(58) Field of Classification Search .................. 257/777, 257/E27.11, 48, 774, E23.011, E23.02
See application file for complete search history.

(56) References Cited

U.S. PATENT DOCUMENTS

| 7,489,030 B2 | 2/2009 | Shibata et al. |
| 2005/0127755 A1 | 6/2005 | Aichriedler et al. |
| 2010/0060310 A1* | 3/2010 | Laisne et al. .................... 326/10 |

FOREIGN PATENT DOCUMENTS

JP 2007-158237 A 6/2007

OTHER PUBLICATIONS

United States Office Action dated Aug. 23, 2012 in U.S. Appl. No. 12/923,800.
United States Office Action dated Feb. 1, 2012 in U.S. Appl. No. 12/923,800.
United States Office Action dated Feb. 15, 2012 in U.S. Appl. No. 12/923,800.

* cited by examiner

*Primary Examiner* — Marc Armand
(74) *Attorney, Agent, or Firm* — McGinn IP Law Group, PLLC

(57) ABSTRACT

A semiconductor device includes a first semiconductor chip that includes a driver circuit, a second semiconductor chip that includes a receiver circuit and an external terminal, and a plurality of through silicon vias that connect the first semiconductor chip and the second semiconductor chip. The first semiconductor chip further includes an output switching circuit that selectively connects the driver circuit to any one of the through silicon vias, the second semiconductor chip further includes an input switching circuit that selectively connects the receiver circuit to any one of the through silicon vias and the external terminal, the input switching circuit includes tri-state inverters each inserted between the receiver circuit and an associated one of the through silicon vias and the external terminal, and the input switching circuit activates any one of the tri-state inverters.

18 Claims, 10 Drawing Sheets

SEMICONDUCTOR DEVICE

This application is a Continuation application of U.S. patent application Ser. No. 12/923,787, filed on Oct. 7, 2010, which, in turn, claims priority to Japanese Patent Application 2009-235490, filed on Oct. 9, 2009.

BACKGROUND OF THE INVENTION

1. Field of the Invention

The present invention relates to a semiconductor device, and more particularly relates to a semiconductor device including a plurality of semiconductor chips electrically connected by through silicon vias.

2. Description of Related Art

A memory capacity required in semiconductor memory devices such as DRAM (Dynamic Random Access Memory) is increasing every year. In recent years, there has been proposed a method to meet this requirement. In this method, a plurality of memory chips are stacked and electrically connected via through silicon vias arranged on a silicon substrate (see Japanese Patent Application Laid-open No. 2007-158237).

As an example, a type of semiconductor memory device is considered here, in which an interface chip having front end units such as interface circuits integrated therein and a core chip having back end units such as memory cores integrated therein are stacked. The core chip does not operate as a single chip, because the core chip does not include a front end unit. That is, an interface chip is required to operate a core chip.

Test pads (external terminals) are generally provided in a core chip to make it possible to test an operation of the core chip when it is at a stage of a wafer. A single core chip can be tested without using any interface chip, by sending a test signal to the core chip via test pads.

A signal is sent to a receiver circuit of the core chip from a driver circuit of the interface chip via the through silicon vias. However, the entire chip becomes defective if even one of the through silicon vias is defective, and if a plurality of the chips are stacked, then all the chips become defective. To prevent the entire chip from becoming defective due to a defective through silicon via, auxiliary through silicon vias are sometimes provided in such semiconductor memory devices.

In the semiconductor device disclosed in Japanese Patent Application Laid-open No. 2007-158237, one auxiliary through silicon via is allocated to a group of through silicon vias constituted by a plurality of through silicon vias (for example, eight through silicon vias). If a defect occurs in one of the through silicon vias belonging to the group, the defective through silicon via is relieved by the auxiliary through silicon via allocated to the group.

Because there are auxiliary through silicon vias, one driver circuit selects one through silicon via from the plurality of the through silicon vias. Therefore, a switch (hereinafter, "secondary switch") becomes necessary at an input side of the receiver circuit to selectively connect to the receiver circuit one path from a plurality of paths that connect each of the through silicon vias to the receiver circuit.

Moreover, a switch (hereinafter, "primary switch") becomes necessary to selectively connect to the receiver circuit a path between a path that connects a through silicon via to the receiver circuit and a path that connects an external terminal to the receiver circuit.

In the above configuration, when a signal travels from the through silicon via to the receiver circuit, it passes through two switches, namely, the primary switch and the secondary switch.

However, loads of these switches exert a substantial adverse effect on the signal and this may cause degradation in signal quality.

This problem is not limited to semiconductor memory devices such as DRAMs, but can occur to all semiconductor devices including semiconductor chips that are electrically connected to each other via through silicon vias.

SUMMARY

In one embodiment, there is provided a semiconductor device that includes a first semiconductor chip that includes a driver circuit; a second semiconductor chip that includes a receiver circuit to which a signal from the driver circuit or a signal from an external terminal is input; and a plurality of through silicon vias that connect the first semiconductor chip and the second semiconductor chip. The first semiconductor chip includes an output switching circuit that selectively connects an output terminal of the driver circuit to any one of the through silicon vias. The second semiconductor chip includes an input switching circuit that selectively connects an input terminal of the receiver circuit to anyone of the through silicon vias and the external terminal.

According to the present invention, in a stacked semiconductor device in which a plurality of through silicon vias can be selectively used, it is easy to maintain a good signal quality at a reception side even in a case where an external terminal for testing is provided on a signal reception side.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
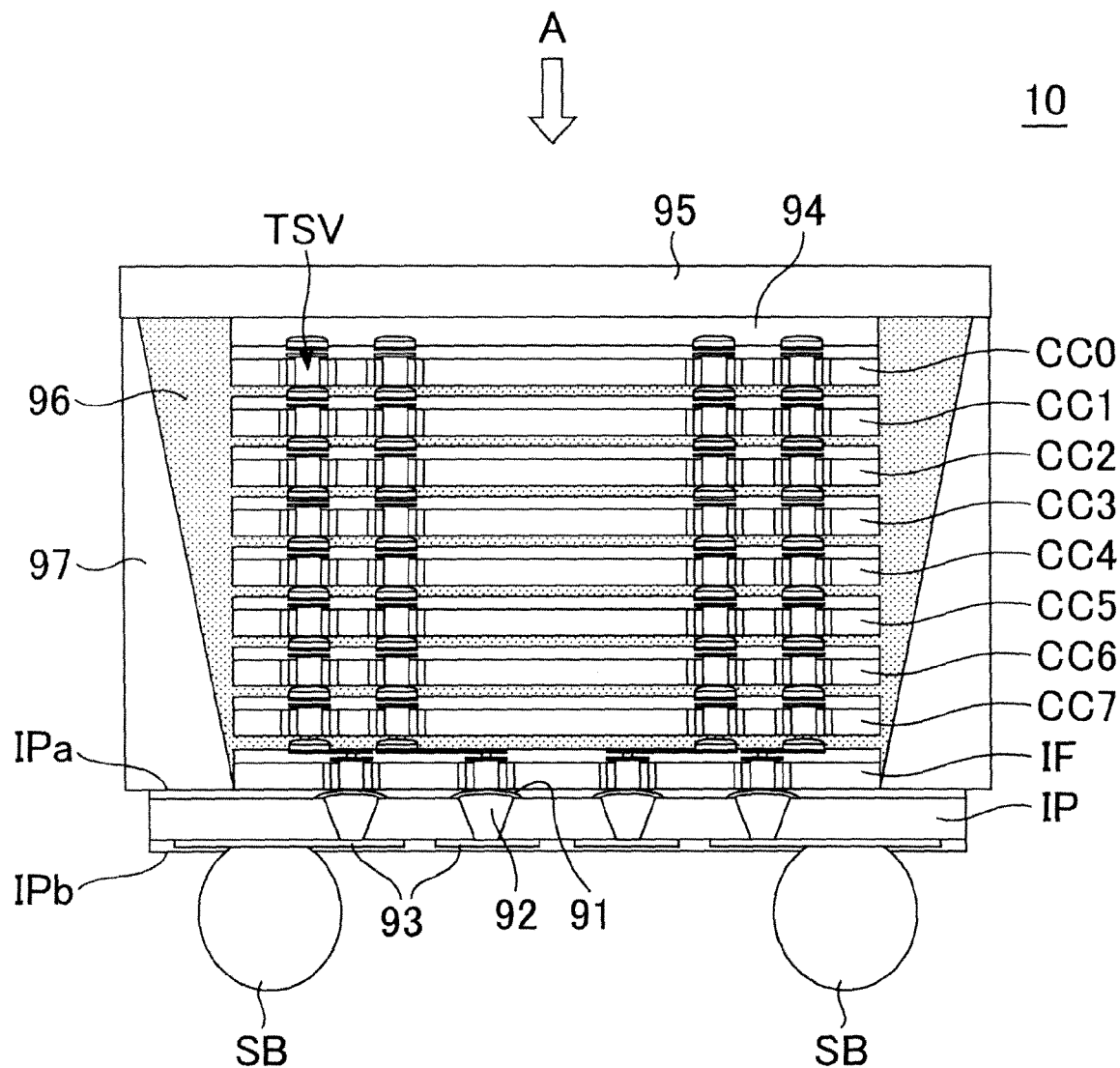
FIG. 1 is a schematic cross-sectional view provided to explain the structure of a semiconductor memory device according to the preferred embodiment of the present invention.

FIG. 1 is a schematic cross-sectional view provided to explain the structure of a semiconductor memory device 10 according to the preferred embodiment of the present invention.

As shown in FIG. 1, the semiconductor memory device 10 according to this embodiment has the structure where 8 core chips CC0 to CC7 that have the same function and structure and are manufactured using the same manufacture mask, an interface chip IF that is manufactured using a manufacture mask different from that of the core chips and an interposer IP are laminated. The core chips CC0 to CC7 and the interface chip IF are semiconductor chips using a silicon substrate and are electrically connected to adjacent chips in a vertical direction through plural Through Silicon Vias (TSV) penetrating the silicon substrate. Meanwhile, the interposer IP is a circuit board that is made of a resin, and plural external terminals (solder balls) SB are formed in a back surface IPb of the interposer IP.

Each of the core chips CC0 to CC7 is a semiconductor chip which consists of circuit blocks other than a so-called front end unit (front end function) performing a function of an interface with an external device through an external terminal among circuit blocks included in a 1 Gb DDR3 (Double Data Rate 3)-type SDRAM (Synchronous Dynamic Random Access Memory). The SDRAM is a well-known and common memory chip that includes the front end unit and a so-called back end unit having a plural memory cells and accessing to the memory cells. The SDRAM operates even as a single chip and is capable to communicate directly with a memory controller. That is, each of the core chips CC0 to CC7 is a semiconductor chip where only the circuit blocks belonging to the back end unit are integrated in principle. As the circuit blocks that are included in the front end unit, a parallel-serial converting circuit (data latch circuit) that performs parallel/serial conversion on input/output data between a memory cell array and a data input/output terminal and a DLL (Delay Locked Loop) circuit that controls input/output timing of data are exemplified, which will be described in detail below. The interface chip IF is a semiconductor chip in which only the front end unit is integrated. Accordingly, an operation frequency of the interface chip is higher than an operation frequency of the core chip. Since the circuits that belong to the front end unit are not included in the core chips CC0 to CC7, the core chips CC0 to CC7 cannot be operated as the single chips, except for when the core chips are operated in a wafer state for a test operation in the course of manufacturing the core chips. The interface chip IF is needed to operate the core chips CC0 to CC7. Accordingly, the memory integration of the core chips is denser than the memory integration of a general single chip. In the semiconductor memory device 10 according to this embodiment, the interface chip has a front end function for communicating with the external device at a first operation frequency, and the plural core chips have a back end function for communicating with only the interface chip at a second operation frequency lower than the first operation frequency. Accordingly, each of the plural core chips includes a memory cell array that stores plural information, and a bit number of plural read data for each I/O (DQ) that are supplied from the plural core chips to the interface chip in parallel is plural and associated with a one-time read command provided from the interface chip to the core chips. In this case, the plural bit number corresponds to a pre-fetch data number to be well-known.

The interface chip IF functions as a common front end unit for the eight core chips CC0 to CC7. Accordingly, all external accesses are performed through the interface chip IF and inputs/outputs of data are also performed through the interface chip IF. In this embodiment, the interface chip IF is disposed between the interposer IP and the core chips CC0 to CC7. However, the position of the interface chip IF is not restricted in particular, and the interface chip IF may be disposed on the core chips CC0 to CC7 and may be disposed on the back surface IPb of the interposer IP. When the interface chip IF is disposed on the core chips CC0 to CC7 in a face-down manner or is disposed on the back surface IPb of the interposer IP in a face-up manner, the TSV does not need to be provided in the interface chip IF. The interface chip IF may be disposed to be interposed between the two interposers IP.

The interposer IP functions as a rewiring substrate to increase an electrode pitch and secures mechanical strength of the semiconductor memory device 10. That is, an electrode 91 that is formed on a top surface IPa of the interposer IP is drawn to the back surface IPb via a through-hole electrode 92 and the pitch of the external terminals SB is enlarged by the rewiring layer 93 provided on the back surface IPb. In FIG. 1, only the two external terminals SB are shown. In actuality, however, three or more external terminals are provided. The layout of the external terminals SB is the same as that of the DDR3-type SDRAM that is determined by the regulation. Accordingly, the semiconductor memory device can be treated as one DDR3-type SDRAM from the external controller.

As shown in FIG. 1, a top surface of the uppermost core chip CC0 is covered by an NCF (Non-Conductive Film) 94 and a lead frame 95. Gaps between the core chips CC0 to CC7 and the interface chip IF are filled with an underfill 96 and surrounding portions of the gaps are covered by a sealing resin 97. Thereby, the individual chips are physically protected.

Figures 2A, 2B, 2C:
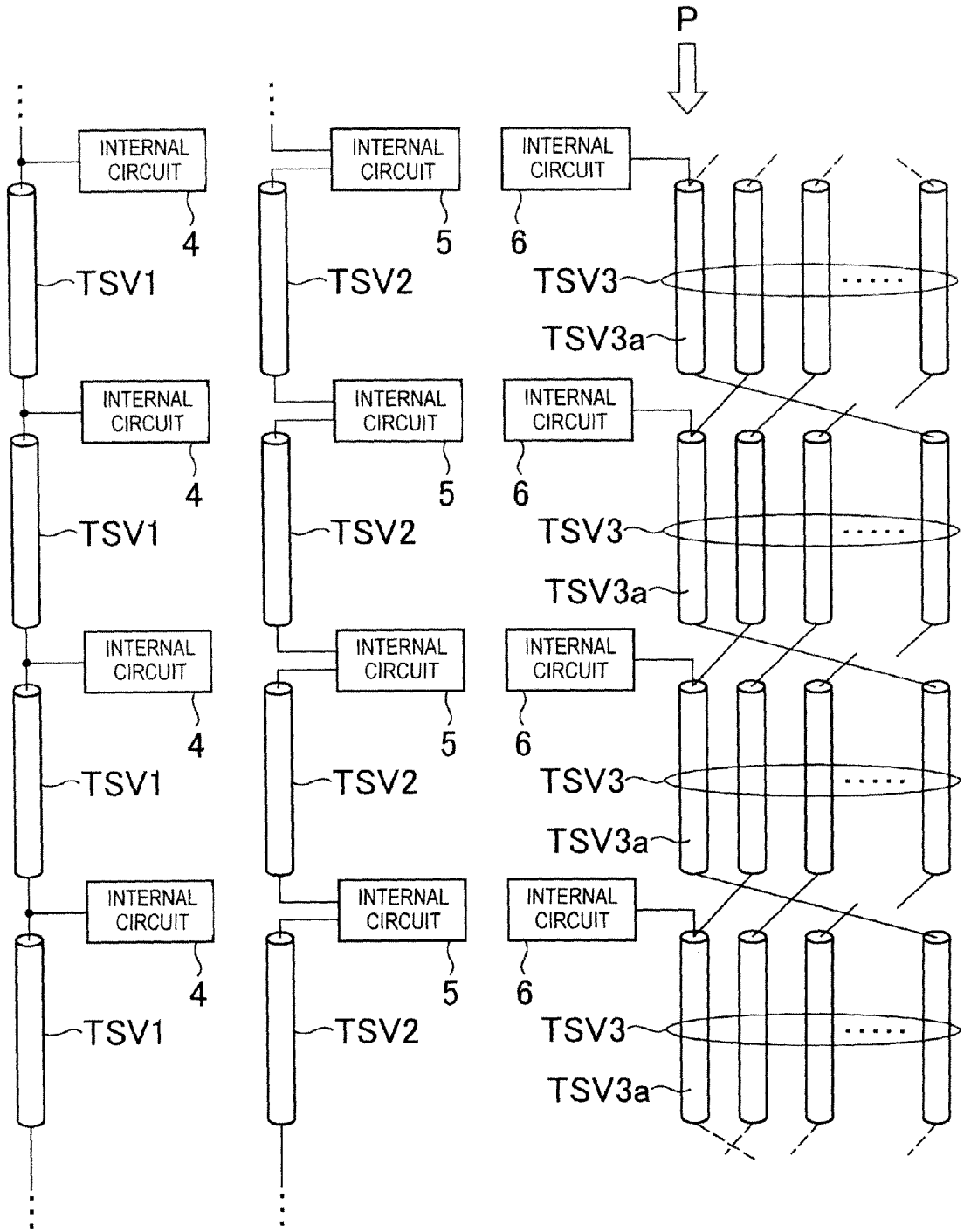
FIGS. 2A to 2C are diagram showing the various types of TSV provided in a core chip.

When most of the TSVs provided in the core chips CC0 to CC7 are two-dimensionally viewed from a lamination direction, that is, viewed from an arrow A shown in FIG. 1, the TSVs are short-circuited from the TSVs of other layers provided at the same position. That is, as shown in FIG. 2A, the vertically disposed TSV1s that are provided at the same position in plain view are short-circuited, and one wiring line is configured by the TSV1. The TSV1 that are provided in the core chips CC0 to CC7 are connected to internal circuits in the core chips, respectively. Accordingly, input signals (command signal, address signal, etc.) that are supplied from the interface chip IF to the TSV1s shown in FIG. 2A are commonly input to the internal circuits 4 of the core chips CC0 to CC7. Output signals (data etc.) that are supplied from the core chips CC0 to CC7 to the TSV1 are wired-ORed and input to the interface chip IF.

Meanwhile, as shown in FIG. 2B, the a part of TSVs are not directly connected to the TSV2 of other layers provided at the same position in plain view but are connected to the TSV2 of other layers through the internal circuits 5 provided in the core chips CC0 to CC7. That is, the internal circuits 5 that are provided in the core chips CC0 to CC7 are cascade-connected through the TSV2. This kind of TSV2 is used to sequentially transmit predetermined information to the internal circuits 5 provided in the core chips CC0 to CC7. As this information, layer address information to be described below is exemplified.

Another TSV group is short-circuited from the TSVs of other layer provided at the different position in plain view, as shown in FIG. 2C. With respect to this kind of TSV group 3, internal circuits 6 of the core chips CC0 to CC7 are connected to the TSV3a provided at the predetermined position P in plain view. Thereby, information can be selectively input to the internal circuits 6 provided in the core chips. As this information, defective chip information to be described below is exemplified.

As such, as types of the TSVs provided in the core chips CC0 to CC7, three types (TSV1 to TSV3) shown in FIGS. 2A to 2C exist. As described above, most of the TSVs are of a type shown in FIG. 2A, and an address signal, a command signal, and a clock signal are supplied from the interface chip IF to the core chips CC0 to CC7, through the TSV1 of the type shown in FIG. 2A. Read data and write data are input to and output from the interface chip IF through the TSV1 of the type shown in FIG. 2A. Meanwhile, the TSV2 and TSV3 of the types shown in FIGS. 2B and 2C are used to provide individual information to the core chips CC0 to CC7 having the same structure.

Figure 3:
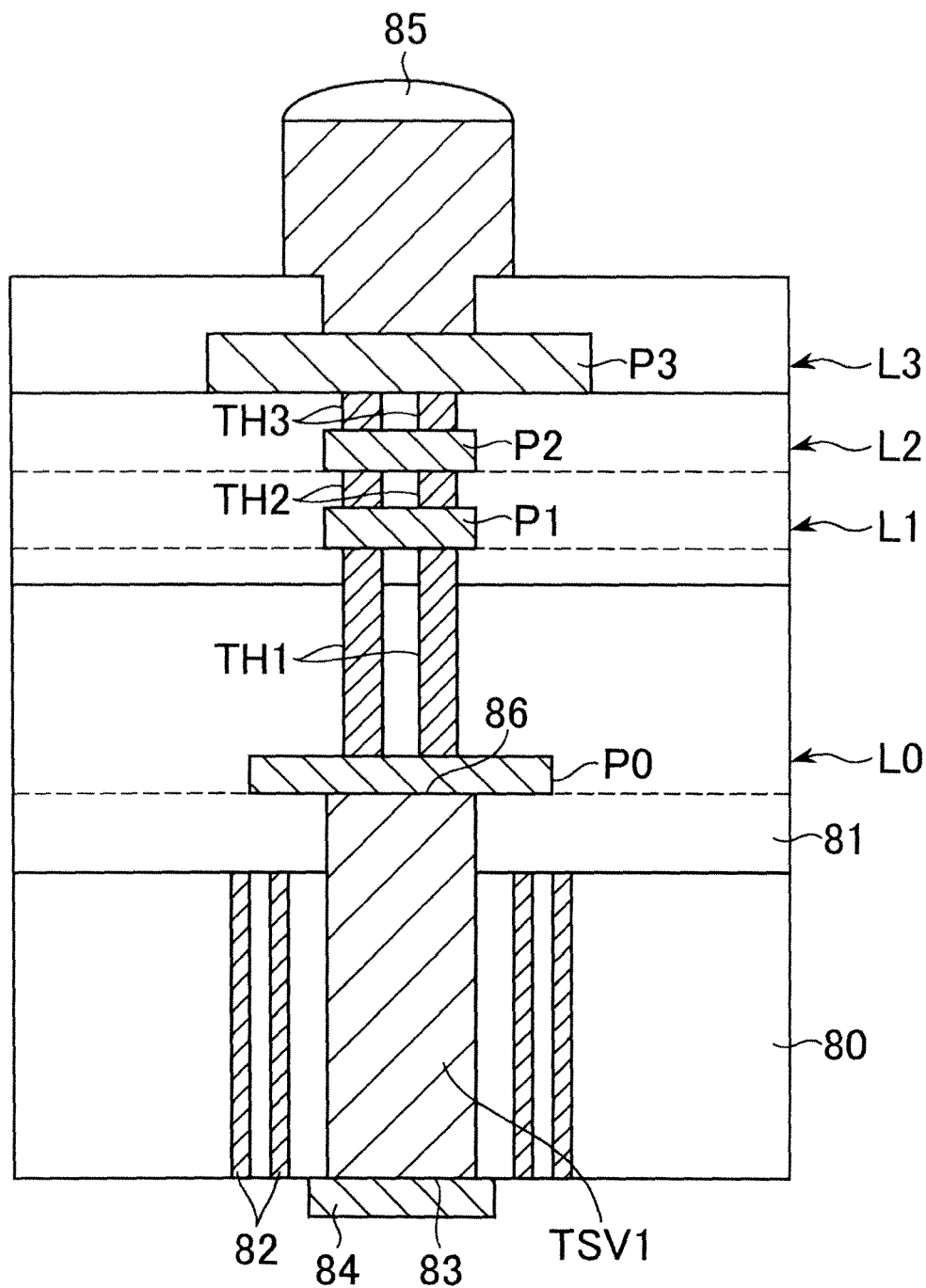
FIG. 3 is a cross-sectional view illustrating the structure of the TSV1 of the type shown in FIG. 2A.

FIG. 3 is a cross-sectional view illustrating the structure of the TSV1 of the type shown in FIG. 2A.

As shown in FIG. 3, the TSV1 is provided to penetrate a silicon substrate 80 and an interlayer insulating film 81 provided on a surface of the silicon substrate 80. Around the TSV1, an insulating ring 82 is provided. Thereby, the TSV1 and a transistor region are insulated from each other. In an example shown in FIG. 3, the insulating ring 82 is provided double. Thereby, capacitance between the TSV1 and the silicon substrate 80 is reduced.

An end 83 of the TSV1 at the back surface of the silicon substrate 80 is covered by a back surface bump 84. The back surface bump 84 is an electrode that contacts a surface bump 85 provided in a core chip of a lower layer. The surface bump 85 is connected to an end 86 of the TSV1, through plural pads P0 to P3 provided in wiring layers L0 to L3 and plural through-hole electrodes TH1 to TH3 connecting the pads to each other. Thereby, the surface bump 85 and the back surface bump 84 that are provided at the same position in plain view are short-circuited. Connection with internal circuits (not shown in the drawings) is performed through internal wiring lines (not shown in the drawings) drawn from the pads P0 to P3 provided in the wiring layers L0 to L3.

Figure 4:
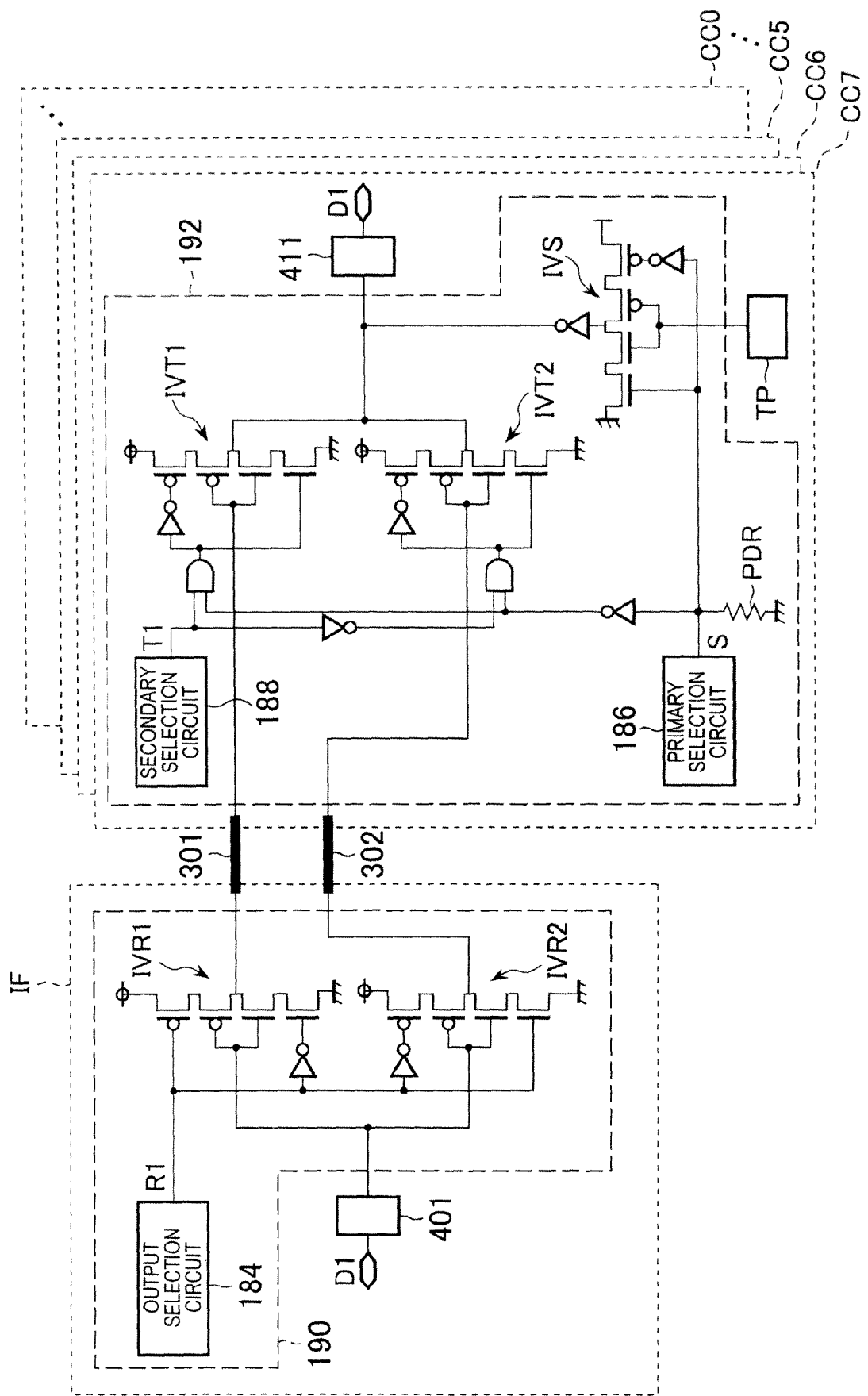
FIG. 4 is a schematic diagram partially showing a connection between the interface chip IF and the core chips.

FIG. 4 is a schematic diagram partially showing a connection between the interface chip IF and the core chips CC0 to CC7. As a representative example, FIG. 4 shows the connection between the interface chip IF and the core chip CC7. However, the same connection relation holds true on other core chips CC0 to CC6. The same holds true on other drawings.

The interface chip IF includes a driver circuit 401 and an output switching circuit 190. The core chip CC7 includes an input switching circuit 192 and a receiver circuit 411. The driver circuit 401 on the interface chip IF and the receiver circuit 411 on the core chip CC7 are electrically connected via two through silicon vias 301 and 302. A data signal D1 transmitted from the driver circuit 401 reaches the receiver circuit 411 via any one of the through silicon vias 301 and 302.

The output switching circuit 190 on the interface chip IF selects any one of the through silicon vias 301 and 302 as a transmission path for the data signal D1. On the other hand, the input switching circuit 192 on the core chip CC7 selects any one of the through silicon vias 301 and 302 as a reception path of the data signal D1. When the output switching circuit 190 selects the through silicon via 301, the input switching circuit 192 also selects the through silicon via 301. When the output switching circuit 190 selects the through silicon via 302, the input switching circuit 192 also selects the through silicon via 302.

In addition to selecting one through silicon via between the through silicon vias 301 and 302, the input switching circuit 192 can select a test pad TP. The input switching circuit 192 selects the test pad TP when performing an operation test on the core chip CC7. When the input switching circuit 192 selects the test pad TP, a test signal output from the test pad TP is supplied to the receiver circuit 411 instead of the data signal D1 output from the driver circuit 401. That is, the input switching circuit 192 is a circuit that selects one from three candidates, which are the through silicon vias 301 and 302, and the test pad TP.

The output switching circuit 190 includes two tri-state inverters IVR1 and IVR2, and an output selection circuit 184. The tri-state inverter IVR1 is inserted on a path that connects the driver circuit 401 to the through silicon via 301, and the tri-state inverter IVR2 is inserted on a path that connects the driver circuit 401 to the through silicon via 302. The tri-state inverter IVR1 includes two selecting transistors connected between a power source and ground. Each of the selecting transistors includes a PMOS (Positive channel Metal Oxide Semiconductor) FET (Field effect transistor) and an NMOS (Negative channel Metal Oxide Semiconductor). Unless both the selecting transistors are activated, the tri-state inverter IVR1 does not function as an inverter and its output is maintained at a high impedance state. The same applies to the tri-state inverter IVR2.

A binary (H, L) output selection signal R1 is supplied to the selecting transistors of the tri-state inverters IVR1 and IVR2 from the output selection circuit 184. When the output selection signal R1 is H (high logical level), the tri-state inverter IVR1 is inactivated and the tri-state inverter IVR2 is activated. On the other hand, when the output selection signal R1 is L (low logical level), the tri-state inverter IVR1 is activated and the tri-state inverter IVR2 is inactivated. That is, the through silicon via 302 is selected when the output selection signal R1 is H, and the through silicon via 301 is selected when the output selection signal R1 is L. In this manner, the data signal D1 output from the driver circuit 401 is input into the core chip CC7 via one of the through silicon vias 301 and 302 depending on a logical level of the output selection signal R1.

The input switching circuit 192 includes three tri-state inverters IVT1, IVT2, and IVS1, a primary selection circuit 186, and a secondary selection circuit 188. Output terminals of the three tri-state inverters IVT1, IVT2, and IVS1 are wired-ORed to an input terminal of the receiver circuit 411.

The tri-state inverter IVT1 is inserted on a path that connects the through silicon via 301 to the receiver circuit 411, and the tri-state inverter IVT2 is inserted on a path that connects the through silicon via 302 to the receiver circuit 411. The tri-state inverter IVS1 is inserted on a path that connects the test pad TP to the receiver circuit 411.

The primary selection circuit 186 supplies a binary (H, L) primary input selection signal S. When the primary input selection signal S is H, the tri-state inverter IVS1 is activated and the path that connects the test pad TP to the receiver circuit 411 becomes conductive. On the other hand, the tri-state inverters IVT1 and IVT2 are inactivated; because, AND gates provided on an input terminal side of each of the tri-state inverters IVT1 and IVT2 are inactivated. Therefore, when the primary input selection signal S is H, only the test pad TP is connected to the receiver circuit 411. Because the tri-state inverters IVT1 and IVT2 are inactivated, the data signal D1 output from the driver circuit 401 does not reach the receiver circuit 411. On the other hand, when the primary input selection signal S is L, because the tri-state inverter IVS1 is inactivated, the test pad TP is disconnected from the receiver circuit 411. Because a pull-down resistor PDR is connected to an output terminal of the primary selection circuit 186, when an output of the primary selection circuit 186 becomes indefinite, such as when the power is turned on, the primary input selection signal S becomes L level.

The secondary selection circuit 188 supplies a binary (H, L) secondary selection signal T1. The secondary selection signal T1 is a signal for activating the tri-state inverter IVT1 or the tri-state inverter IVT2. However, as explained above, when the primary input selection signal S is H, irrespective of the logical level of the secondary selection signal T1, each of the tri-state inverters IVT1 and IVT2 are inactivated.

When the primary input selection signal S is L and the secondary selection signal T1 is H, the tri-state inverter IVT1 is activated and the tri-state inverter IVT2 is inactivated. When the primary input selection signal S is L and the secondary input selection signal T1 is L, the tri-state inverter IVT1 is inactivated and the tri-state inverter IVT2 is activated.

In conclusion, when the primary input selection signal S is H, only the tri-state inverter IVS1 is activated, and the test pad TP is connected to the receiver circuit 411. On the other hand, when the primary input selection signal S is L and the secondary selection signal T1 is H, only the tri-state inverter IVT1 is activated, and the through silicon via 301 is connected to the receiver circuit 411. Moreover, when the primary input selection signal S is L and the secondary selection signal T1 is L as well, only the tri-state inverter IVT2 is activated, and the through silicon via 302 is connected to the receiver circuit 411.

The data signal D1 that has passed through the through silicon via 301 reaches the receiver circuit 411 via the tri-state inverter IVT1. The data signal D1 that has passed through the through silicon via 302 reaches the receiver circuit 411 via the tri-state inverter IVT2. The test signal output from the test pad TP reaches the receiver circuit 411 via the tri-state inverter IVS1. In either case, on the side of the core chip CC7, the data signal D1 or the test signal passes through only one tri-state inverter before reaching the receiver circuit 411. Therefore, this configuration suppresses degradation in the signal quality and generation of signal transmission delay.

When the number of inverters through which the data signal D1 passes before it reaches the receiver circuit 411 from a through silicon via is different from the number of inverters through which the test signal passes before it reaches the receiver circuit 411 from the test pad TP, operating conditions change in a normal operation and a test operation. In this respect, the present embodiment is advantageous in that, because the number of inverters is one in either case, the core chip CC7 can be test operated in almost the same conditions as those in the normal operation.

Figure 5:
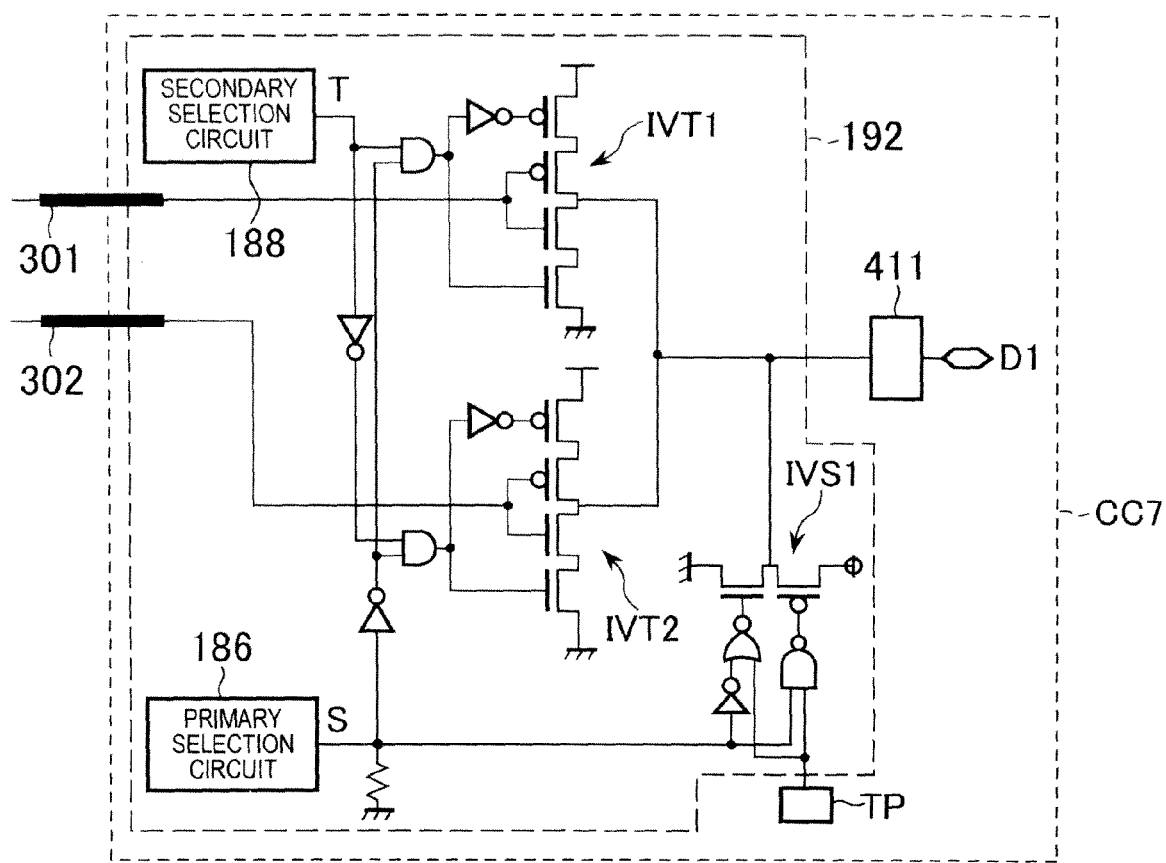
FIG. 5 is another exemplary configuration of a core chip.

FIG. 5 shows another exemplary configuration of the core chip CC7. In the configuration shown in FIG. 5, the input switching circuit 192 of the core chip CC7 includes the tri-state inverters IVT1 and IVT2, the primary selection circuit 186, and the secondary selection circuit 188. Furthermore, the core chip CC7 includes the tri-state inverter IVS1 of a type that does not include a selecting transistor. Instead of the selecting transistor, a NOT gate, a NOR gate, and an AND gate are connected to an input terminal of the tri-state inverter IVS1. When the primary input selection signal S is H, a test signal is directly input into the tri-state inverter IVS1. At this time, both the tri-state inverters IVT1 and IVT2 are inactivated. Meanwhile, when the primary input selection signal S is L, irrespective of a logical level of the test signal, all the FETs included in the tri-state inverter IVS1 are turned off, so that an output of the tri-state inverter IVS1 is at a high impedance state. The control logic of the tri-state inverters IVT1 and IVT2 is the same as that explained in relation to the explanation of FIG. 4.

Figure 6:
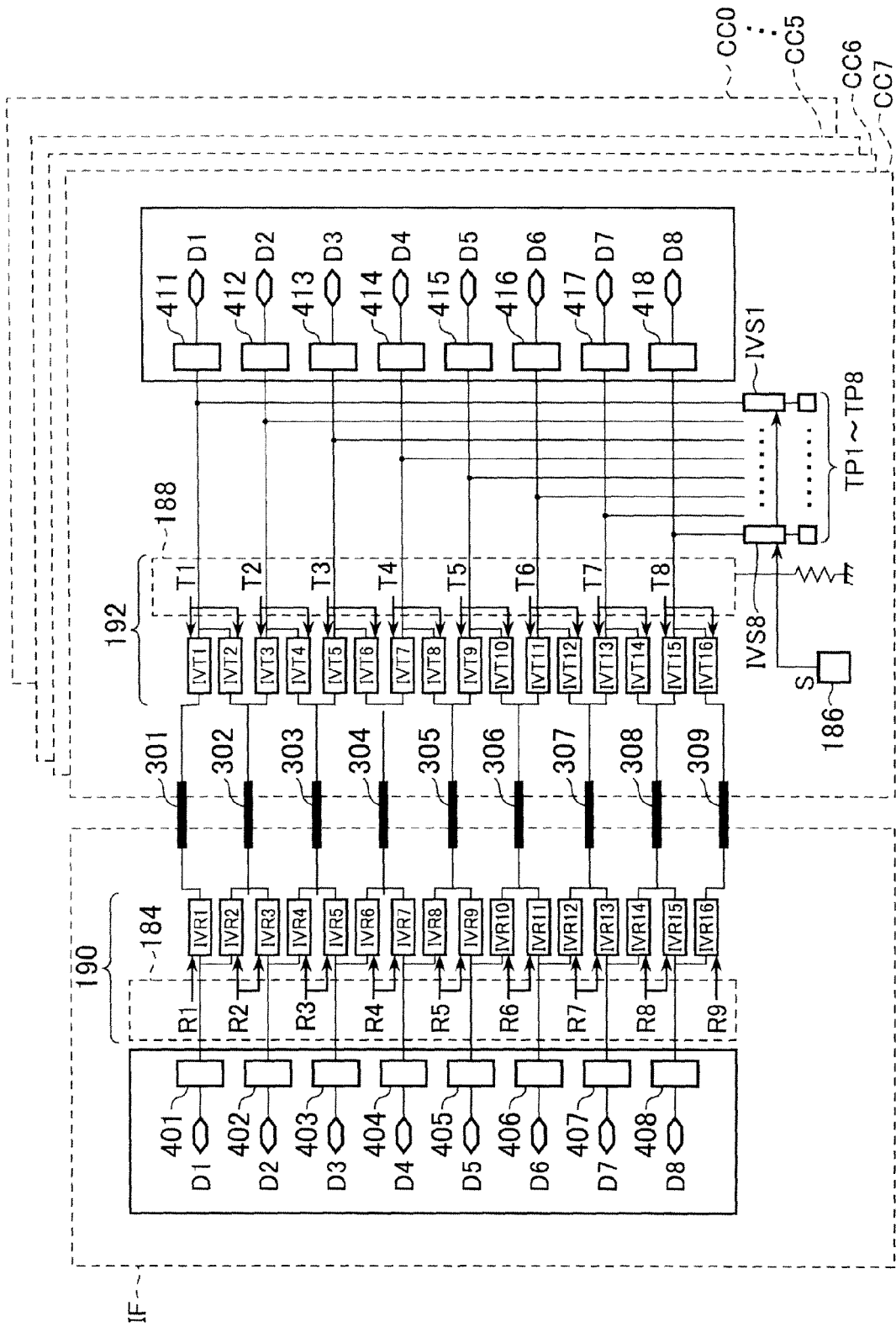
FIG. 6 is a schematic diagram showing an overall connection between the interface chip IF and the core chips.

FIG. 6 is a schematic diagram showing an overall connection between the interface chip IF and the core chips CC0 to CC7. FIG. 6 shows 8-bit data D1 to D8 are supplied from the interface chip IF to each of the core chips CC0 to CC7. The data D1 to D8 are signals that need to be simultaneously output from the interface chip IF and simultaneously input into each of the core chips CC0 to CC7. Address signals and write data are examples of such data. In FIG. 6, an example of the core chip CC7 is explained.

As shown in FIG. 6, the interface chip IF includes eight driver circuits 401 to 408 corresponding to the data D1 to D8, and the core chips CC0 to CC7 include eight receiver circuits 411 to 418, respectively, corresponding to the data D1 to D8. Whereas in the present embodiment, nine (8+1) through silicon vias 301 to 309 are provided to connect the driver circuits 401 to 408 to the receiver circuits 411 to 418. Among the through silicon vias 301 to 309, the through silicon via 309 is an auxiliary through silicon via. The through silicon via 309 is not used unless any of the other through silicon vias 301 to 308 is defective.

The interface chip IF includes the output selection circuit 184 that connects an output terminal of each of the driver circuits 401 to 408 to one of two corresponding through silicon vias via tri-state inverters IVR1 to IVR16. The two corresponding through silicon vias here means an i-th through silicon via and an (i+1)-th through silicon via when a last digit of the reference numeral of the driver circuits 401 to 408 is taken as i (i is a value from 1 to 8). For example, a first through silicon via 301 and a second through silicon via 302 correspond to the driver circuit 401, and the second through silicon via 302 and a third through silicon via 303 correspond to the driver circuit 402. Thus, some of the through silicon vias, that is, the through silicon vias 302 to 308, correspond to two driver circuits. However, two driver circuits are never connected to the same through silicon via. Thus, connection is made to only one through silicon via at a given time point. As for which one of the through silicon vias is to be selected, it is determined by output selection signals R1 to R9.

As shown in FIG. 6, the output selection signals R1 to R9 are respectively allocated to the through silicon vias 301 to 309. The output selection signal R1 activates the tri-state inverter IVR1 and the secondary selection signal T1 activates the tri-state inverter IVT1. In this case, the driver circuit 401 is connected to the receiver circuit 411 via the through silicon via 301. Similarly, among the tri-state inverters IVR1 to IVR16, and IVT1 to IVT16, the tri-state inverters (IVR1, IVR3, IVR5, . . . , IVR15, IVT1, IVT3, IVT5, . . . , IVT15) having the last digit of the reference numeral as an odd number are activated. As a result, the driver circuits 402 to 408 are connected to the receiver circuits 412 to 418 via the through silicon vias 302 to 308. The auxiliary through silicon via 309 is not used.

The same connection relation holds true on the core chips CC0 to CC6. Each of the core chips CC0 to CC7 includes the input switching circuit 192, and input terminals of the receiver circuits 411 to 418 are respectively connected to the through silicon vias 301 to 308 via the tri-state inverters IVT1 to IVT16.

The auxiliary through silicon via 309 is used when one of the through silicon vias 301 to 308 becomes defective. The defective through silicon via is not simply replaced by the auxiliary through silicon via 309; however, a connection relation between the through silicon vias 301 to 309 and the driver circuits 401 to 408, and a connection relation between the through silicon vias 301 to 309 and the receiver circuits 411 to 418 are shifted with the defective through silicon via as a boundary.

When a through silicon via 30x (x is a value from 1 to 8) is defective, an i-th through silicon via is selected for a driver circuit whose last digit of the reference numeral is 1 to x−1 and an (i+1)-th through silicon via is selected for a driver circuit whose last digit of the reference numeral is x to 8.

As a specific example, it is assumed that a defect has occurred in the through silicon via 306. Although the defect has occurred in the through silicon via 306, the driver circuits 401 to 405 use the through silicon vias 301 to 305 in a usual manner. That is, the tri-state inverters (IVR1, IVR3, IVR5, IVR7, IVR9, IVT1, IVT3, IVT5, and IVT9) having the last digit of the reference numeral as the odd number are activated in the same order for the driver circuits 401 to 405.

The tri-state inverters (IVR12, IVR14, IVR16, IVT12, IVT14, and IVT16) having the last digit of the reference numeral as an even number are activated for the driver circuits 406 to 408. As a result, the driver circuit 406 is connected to the receiver circuit 416 via the next through silicon via 307 instead of the through silicon via 306, and the driver circuits 407 and 408 are connected to the receiver circuits 417 and 418 via the through silicon vias 308 and 309, respectively. In this manner, the connection relation between the driver circuits 401 to 408 and the through silicon vias 301 to 309 is shifted with the defective through silicon via 306 as a boundary.

That is, when the through silicon via 30x is defective, a driver circuit 40i (i<x) is connected to a receiver circuit 41i via a through silicon via 30i, and the driver circuit 40i (i≧x) is connected to the receiver circuit 41i via a through silicon via 30 (i+1).

Specifically, the defective through silicon via 306 is not simply replaced by the auxiliary through silicon via 309; however, the connection relation between the through silicon vias 301 to 309 and the driver circuits 401 to 408, and the connection relation between the through silicon vias 301 to 309 and the receiver circuits 411 to 418 are shifted with the defective through silicon via 306 as a boundary. In this manner, even after replacement of the through silicon via, an output terminal of a driver circuit having a relatively larger reference numeral is connected to a through silicon via having a relatively larger reference numeral, and an input terminal of a receiver circuit having a relatively larger reference numeral is connected to the through silicon via having the relatively larger reference numeral. Therefore, when the through silicon vias 301 to 309 are arranged in this order, as far as the i-th through silicon via and the (i+1)-th through silicon via are arranged adjacent to each other, a difference in wiring lengths almost does not occur between signal paths before and after replacement of the through silicon vias. Because almost no skew is generated due to replacement of through silicon vias, the signal quality can be enhanced.

At the time of testing, the primary selection circuit 186 changes the logical level of the primary input selection signal S to H. At this time, tri-state inverters IVS1 to IVS8 are activated and the tri-state inverters IVT1 to IVT16 are inactivated. Connections between the driver circuits 401 to 409 and the receiver circuits 411 to 418, respectively, are disconnected, and only test pads TP1 to TP8 are connected to the receiver circuits 411 to 418, respectively. An operation test can be performed on the receiver circuits 411 to 418 only after the interface chip IF is electrically disconnected from the core chip CC7.

Figure 7:
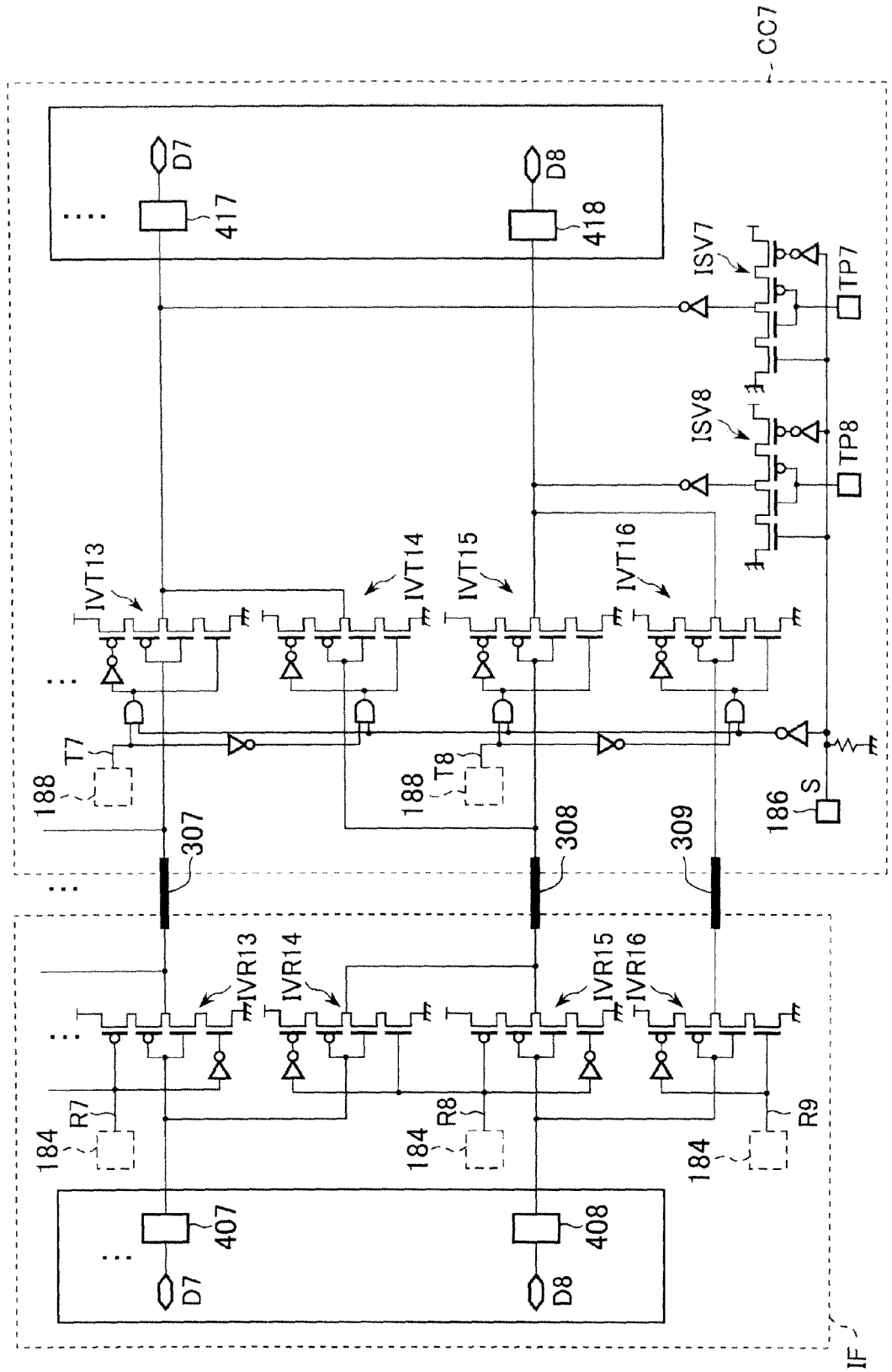
FIG. 7 is a circuit diagram showing the connection shown in FIG. 6 in more detail.

FIG. 7 is a circuit diagram showing the connection shown in FIG. 6 in more detail. When the through silicon via 306 is defective, a logical level of the output selection signal R8 becomes H and the driver circuit 407 is connected to the through silicon via 308 via the tri-state inverter IVR14. Although outputs of the tri-state inverters IVR14 and IVR15 are connected to the through silicon via 308 by wired-OR, the output of the tri-state inverter IVR15 that has become inactive is maintained at a high impedance state. Therefore, transmission of signals from the driver circuit 407 to the through silicon via 308 is not affected. The logical level of the secondary selection signal T7 becomes L during normal operation. Thus, the tri-state inverter IVT14 is activated and the receiver circuit 417 is connected to the through silicon via 308. Although outputs of the tri-state inverters IVT13 and IVT14 are connected to the receiver circuit 417 by wired-OR, the output of the tri-state inverter IVT13 that has become inactive is maintained at a high impedance state. Therefore, transmission of signals from the through silicon via 308 to the receiver circuit 417 is not affected. Similarly, the logical level of the output selection signal R8 becomes H and the driver circuit 408 is connected to the through silicon via 309. The logical level of the secondary selection signal T8 becomes L and the through silicon via 309 is connected to the receiver circuit 418.

When the primary input selection signal S is H, a test signal is sent from the test pads TP8 and TP7 to the receiver circuits 417 and 418, respectively.

Figure 8:
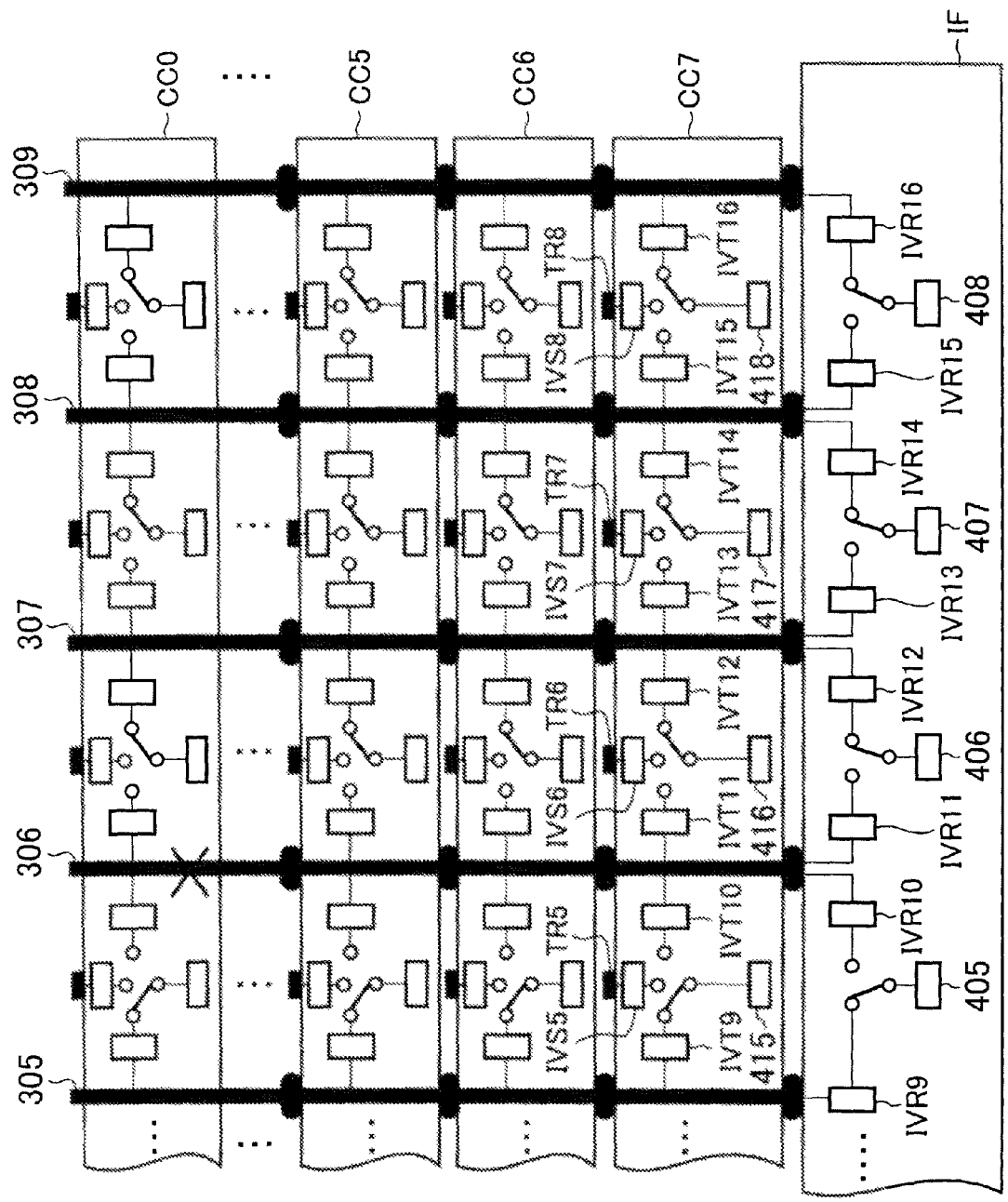
FIG. 8 is a schematic diagram for three-dimensionally showing a connection relation between the interface chip and the core chips.

FIG. 8 is a schematic diagram for three-dimensionally showing a connection relation between the interface chip IF and the core chips CC0 to CC7. FIG. 8 shows a state where the through silicon via 306 in the core chip CC0 among the core chips CC0 to CC7 is defective. When a through silicon via in one of the core chips CC0 to CC7 is defective, the corresponding through silicon vias in the other core chips are all invalidated. In the example shown in FIG. 8, because the through silicon via 306 in the core chip CC0 is defective, the through silicon vias 306 in the other core chips CC1 to CC7 are invalidated irrespective of whether they are defective. That is, the connection relation between the through silicon vias and the driver circuits and the connection relation between the through silicon vias and the receiver circuits are the same in the interface chip IF and the core chips CC0 to CC7.

At the time of the test operation, the receiver circuits 411 to 418 are directly connected to the test pads TP1 to TP8 via the tri-state inverters IVS1 to IVS8. At this time, all the through silicon vias are disconnected from the receiver circuits.

Figure 9:
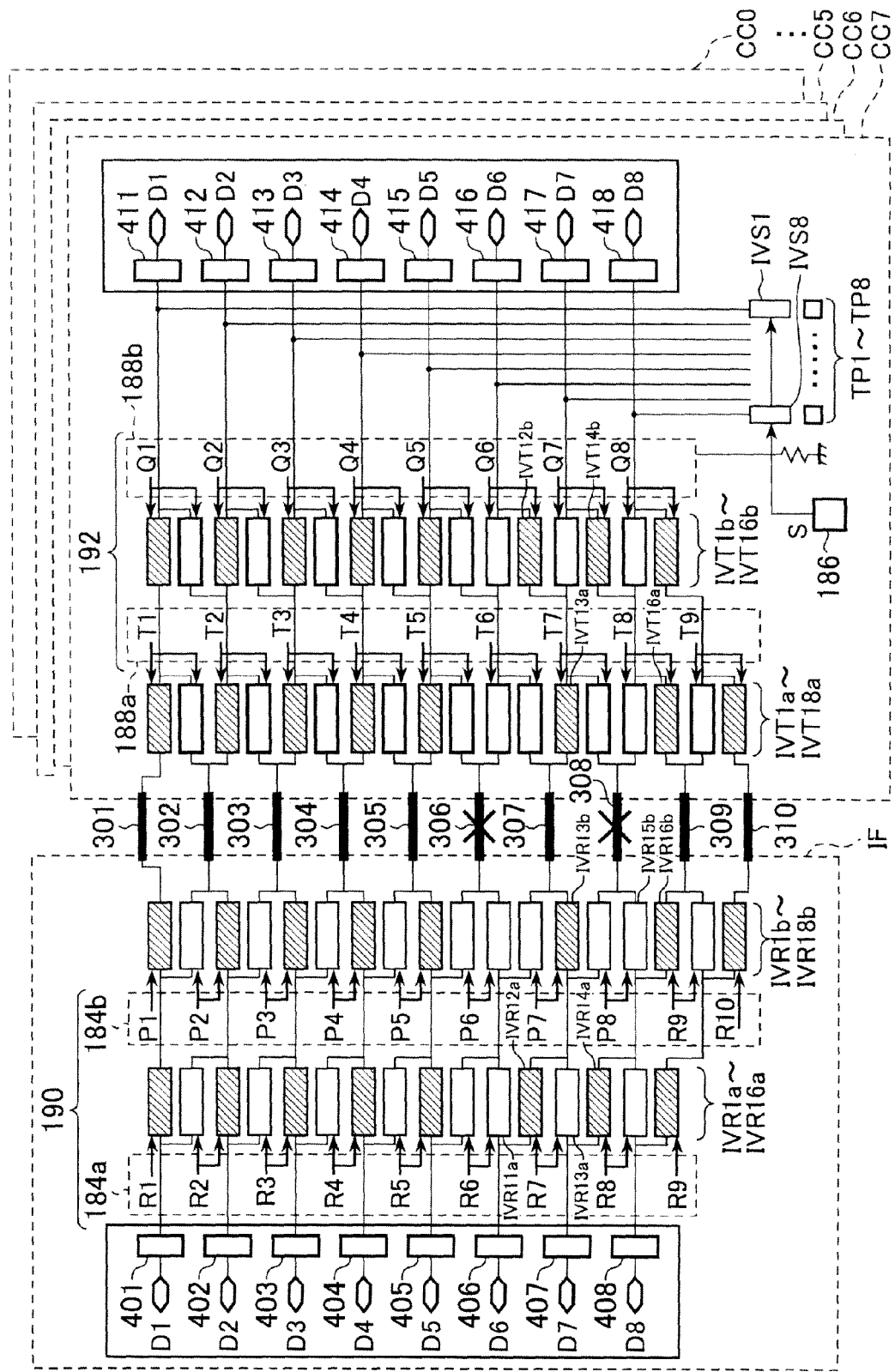
FIG. 9 is a schematic diagram showing another example of an overall connection relation between the interface chip and the core chips.

FIG. 9 is a schematic diagram showing another example of an overall connection relation between the interface chip IF and the core chips CC0 to CC7. FIG. 9 shows a state where the through silicon vias 306 and 308 are defective. In FIG. 9, among the tri-state inverters, the tri-state inverters those are activated are hatched by oblique lines.

As shown in FIG. 9, two auxiliary through silicon vias 309 and 310 are allocated with respect to eight through silicon vias 301 to 308. Thus, the total number of the through silicon vias is ten. Two output selection circuits 184a and 184b are arranged on the interface chip IF side and two secondary selection circuits 188a and 188b are arranged on the core chips CC0 to CC7 side. The output switching circuit 190 includes two stages of tri-state inverters IVR1a to IVR16a and IVR1b to IVR18b. The output selection circuit 184a controls the tri-state inverters IVR1a to IVR16a according to output selection signals R1 to R9. The output selection circuit 184b controls the tri-state inverters IVR1b to IVR18b according to output selection signals P1 to P10.

Similarly, the input switching circuit 192 includes tri-state inverters IVT1a to IVT18a and IVT1b to IVT16b forming a two-step structure. In the secondary selection circuit 188a, secondary input selection signals T1 to T9 control the tri-state inverters IVT1a to IVT18a, and in the secondary selection circuit 188b, secondary input selection signals Q1 to Q8 control the tri-state inverters IVT1b to IVT16b.

By providing the output switching circuits 190 and the input switching circuits 192 that include the tri-state inverters in two stages, the connection relation between the through silicon vias 301 to 310 and the driver circuits 401 to 408, and the connection relation between the through silicon vias 301 to 310 and the receiver circuits 411 to 418 can be shifted by maximum two units.

When one through silicon via 30x (x is a value from 1 to 8) is defective, the i-th through silicon via is selected for the driver circuit whose last digit of the reference numeral is 1 to x−1 and the (i+1)-th through silicon via is selected for the driver circuit whose last digit of the reference numeral is x to 8. When two through silicon vias 30x and 30y (x<y) are defective, the i-th through silicon via is selected for the driver circuit whose last digit of the reference numeral is 1 to x−1, the (i+1)-th through silicon via is selected for a driver circuit whose last digit of the reference numeral is x to y−2, and an (i+2)-th through silicon via is selected for a driver circuit whose last digit of the reference numeral is y−1 to 8.

As a specific example, when the through silicon vias 306 and 308 are defective (x=6 and y=8), the driver circuits 401 to 405 are respectively connected to the receiver circuits 411 to 415 via the through silicon vias 301 to 305. The driver circuit 406 is connected to the through silicon via 307 via the tri-state inverters IVR12a and IVR13b. Furthermore, the through silicon via 307 is connected to the receiver circuit 416 via the tri-state inverters IVT13a and IVT12b. That is, connection is shifted by one through silicon via.

The driver circuit 407 is connected to the through silicon via 309 via the tri-state inverters IVR14a and IVR16b. The through silicon via 309 is connected to the receiver circuit 417 via the tri-state inverters IVT16a and IVT14b. That is, connection is shifted by two through silicon vias. The driver circuit 408 is connected to the receiver circuit 418 via the through silicon via 310.

With the above configuration, when one of the eight through silicon vias 301 to 308 is defective, it is relieved by shifting the connection relation by one through silicon via with the defective through silicon via as a boundary. Furthermore, when two through silicon vias among the nine through silicon vias 301 to 309 are defective, it is relieved by, between the two defective through silicon vias, first, shifting the connection relation by one through silicon via with a defective through silicon via having a relatively smaller reference numeral as a boundary, and then, further shifting the connection relation by one through silicon via with a defective through silicon via having a relatively larger reference numeral as a boundary.

A circuit configuration of the semiconductor memory device 10 according to a preferred embodiment is explained below.

Figure 10:
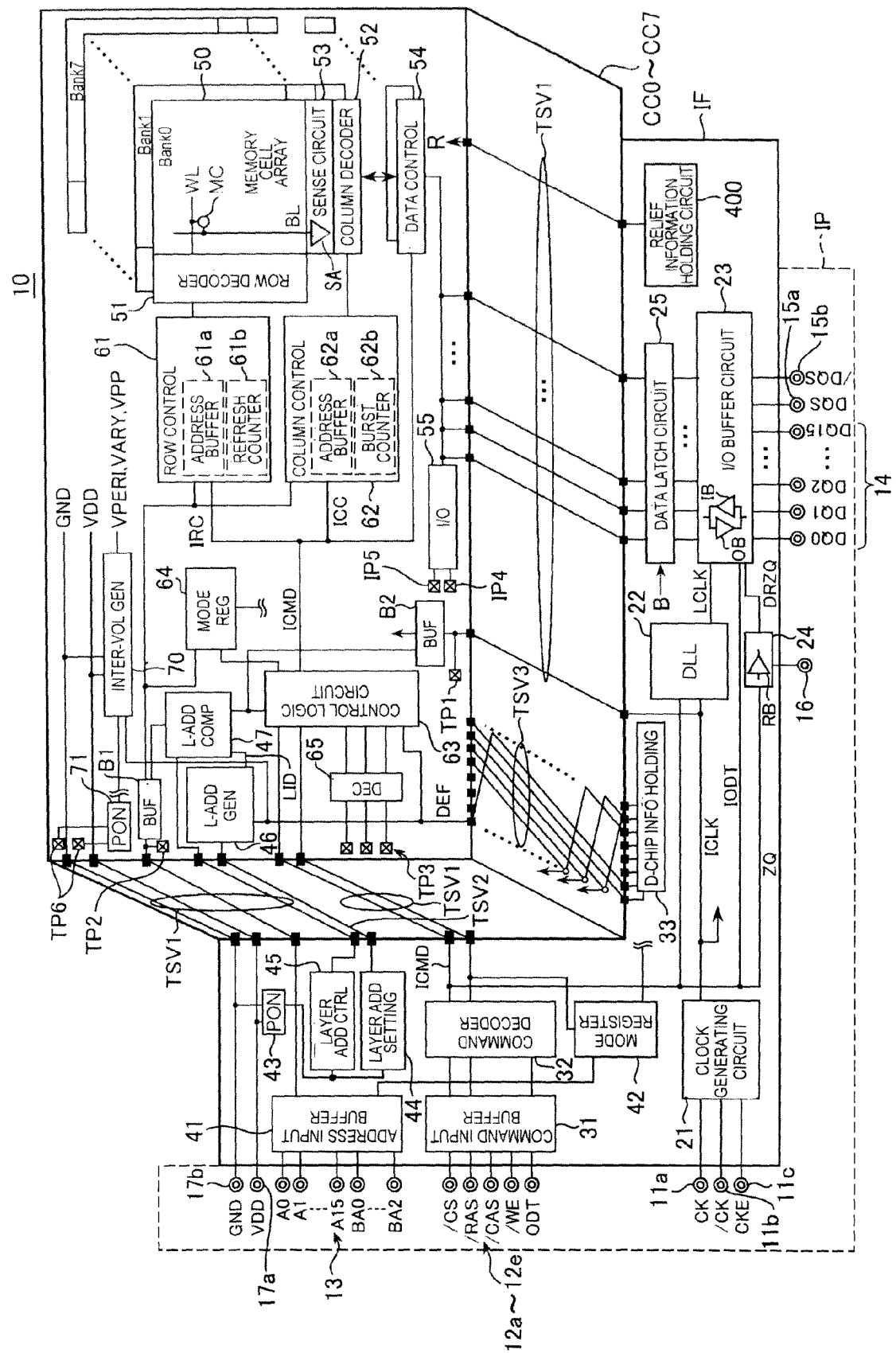
FIG. 10 is a block diagram illustrating the circuit configuration of the semiconductor memory device.

FIG. 10 is a block diagram illustrating the circuit configuration of the semiconductor memory device 10.

As shown in FIG. 10, the external terminals that are provided in the interposer IP include clock terminals 11a and 11b, an clock enable terminal 11c, command terminals 12a to 12e, an address terminal 13, a data input/output terminal 14, data strobe terminals 15a and 15b, a calibration terminal 16, and power supply terminals 17a and 17b. All of the external terminals are connected to the interface chip IF and are not directly connected to the core chips CC0 to CC7, except for the power supply terminals 17a and 17b.

First, a connection relationship between the external terminals and the interface chip IF performing the front end function and the circuit configuration of the interface chip IF will be described.

The clock terminals 11a and 11b are supplied with external clock signals CK and /CK, respectively, and the clock enable terminal 11c is supplied with a clock enable signal CKE. The external clock signals CK and /CK and the clock enable signal CKE are supplied to a clock generating circuit 21 provided in the interface chip IF. A signal where "/" is added to a head of a signal name in this specification indicates an inversion signal of a corresponding signal or a low-active signal. Accordingly, the external clock signals CK and /CK are complementary signals. The clock generating circuit 21 generates an internal clock signal ICLK, and the generated internal clock signal ICLK is supplied to various circuit blocks in the interface chip IF and is commonly supplied to the core chips CC0 to CC7 through the TSVs.

A DLL circuit 22 is included in the interface chip IF and an input/output clock signal LCLK is generated by the DLL circuit 22. The input/output clock signal LCLK is supplied to an input/output buffer circuit 23 included in the interface chip IF. A DLL function is used to control the front end unit by using the signal LCLK synchronized with a signal of the external device, when the semiconductor memory device 10 communicates with the external device. Accordingly, DLL function is not needed for the core chips CC0 to CC7 as the back end.

The command terminals 12a to 12e are supplied with a row-address strobe signal /RAS, a column address strobe signal /CAS, a write enable signal /WE, a chip select signal /CS, and an on-die termination signal ODT. These command signals are supplied to a command input buffer 31 that is provided in the interface chip IF. The command signals supplied to the command input buffer 31 are further supplied to a command decoder 32. The command decoder 32 is a circuit that holds, decodes, and counts the command signals in synchronization with the internal clock ICLK and generates various internal commands ICMD. The generated internal command ICMD is supplied to the various circuit blocks in the interface chip IF and is commonly supplied to the core chips CC0 to CC7 through the TSVs.

The address terminal 13 is a terminal to which address signals A0 to A15 and BA0 to BA2 are supplied, and the supplied address signals A0 to A15 and BA0 to BA2 are supplied to an address input buffer 41 provided in the interface chip IF. An output of the address input buffer 41 is commonly supplied to the core chips CC0 to CC7 through the TSVs. The address signals A0 to A15 are supplied to a mode register 42 provided in the interface chip IF, when the semiconductor memory device 10 enters a mode register set. The address signals BA0 to BA2 (bank addresses) are decoded by an address decoder (not shown in the drawings) provided in the interface chip IF, and a bank selection signal B that is obtained by the decoding is supplied to a data latch circuit 25. This is because bank selection of the write data is performed in the interface chip IF.

The data input/output terminal 14 is used to input/output read data or write data DQ0 to DQ15. The data strobe terminals 15a and 15b are terminals that are used to input/output strobe signals DQS and /DQS. The data input/output terminal 14 and the data strobe terminals 15a and 15b are connected to the input/output buffer circuit 23 provided in the interface chip IF. The input/output buffer circuit 23 includes an input buffer IB and an output buffer OB, and inputs/outputs the read data or the write data DQ0 to DQ15 and the strobe signals DQS and /DQS in synchronization with the input/output clock signal LCLK supplied from the DLL circuit 22. If an internal on-die termination signal IODT is supplied from the command decoder 32, the input/output buffer circuit 23 causes the output buffer OB to function as a termination resistor. An impedance code DRZQ is supplied from the calibration circuit 24 to the input/output buffer circuit 23. Thereby, impedance of the output buffer OB is designated. The input/output buffer circuit 23 includes a well-known FIFO circuit.

The calibration circuit 24 includes a replica buffer RB that has the same circuit configuration as the output buffer OB. If the calibration signal ZQ is supplied from the command decoder 32, the calibration circuit 24 refers to a resistance value of an external resistor (not shown in the drawings) connected to the calibration terminal 16 and performs a calibration operation. The calibration operation is an operation for matching the impedance of the replica buffer RB with the resistance value of the external resistor, and the obtained impedance code DRZQ is supplied to the input/output buffer circuit 23. Thereby, the impedance of the output buffer OB is adjusted to a desired value.

The input/output buffer circuit 23 is connected to a data latch circuit 25. The data latch circuit 25 includes a FIFO circuit (not shown in the drawings) that realizes a FIFO function which operates by latency control realizing the well-known DDR function and a multiplexer MUX (not shown in the drawings). The input/output buffer circuit 23 converts parallel read data, which is supplied from the core chips CC0 to CC7, into serial read data, and converts serial write data, which is supplied from the input/output buffer, into parallel write data. Accordingly, the data latch circuit 25 and the input/output buffer circuit 23 are connected in serial and the data latch circuit 25 and the core chips CC0 to CC7 are connected in parallel. In this embodiment, each of the core chips CC0 to CC7 is the back end unit of the DDR3-type SDRAM and a pre-fetch number is 8 bits. The data latch circuit 25 and each bank of the core chips CC0 to CC7 are connected respectively, and the number of banks that are included in each of the core chips CC0 to CC7 is 8. Accordingly, connection of the data latch circuit 25 and the core chips CC0 to CC7 becomes 64 bits (8 bits×8 banks) for each DQ.

Parallel data, not converted into serial data, is basically transferred between the data latch circuit 25 and the core chips CC0 to CC7. That is, in a common SDRAM (in the SDRAM, a front end unit and a back end unit are constructed in one chip), between the outside of the chip and the SDRAM, data is input/output in serial (that is, the number of data input/output terminals is one for each DQ). However, in the core chips CC0 to CC7, an input/output of data between the interface chip IF and the core chips is performed in parallel. This point is the important difference between the common SDRAM and the core chips CC0 to CC7. However, all of the pre-fetched parallel data do not need to be input/output using the different TSVs, and partial parallel/serial conversion may be performed in the core chips CC0 to CC7 and the number of TSVs that are needed for each DQ may be reduced. For example, all of data of 64 bits for each DQ do not need to be input/output using the different TSVs, and 2-bit parallel/serial conversion may be performed in the core chips CC0 to CC7 and the number of TSVs that are needed for each DQ may be reduced to ½ (32).

To the data latch circuit 25, a function for enabling a test in an interface chip unit is added. The interface chip does not have the back end unit. For this reason, the interface chip cannot be operated as a single chip in principle. However, if the interface chip never operates as the single chip, an operation test of the interface chip in a wafer state may not be performed. This means that the semiconductor memory device 10 cannot be tested in case an assembly process of the interface chip and the plural core chips is not executed, and the interface chip is tested by testing the semiconductor memory device 10. In this case, when a defect that cannot be recovered exists in the interface chip, the entire semiconductor memory device 10 is not available. In consideration of this point, in this embodiment, a portion of a pseudo back end unit for a test is provided in the data latch circuit 25, and a simple memory function is enabled at the time of a test.

The power supply terminals 17a and 17b are terminals to which power supply potentials VDD and VSS are supplied, respectively. The power supply terminals 17a and 17b are connected to a power-on detecting circuit 43 provided in the interface chip IF and are also connected to the core chips CC0 to CC7 through the TSVs. The power-on detecting circuit 43 detects the supply of power. On detecting the supply of power, the power-on detecting circuit 43 activates a layer address control circuit 45 on the interface chip IF.

The layer address control circuit 45 changes a layer address due to the I/O configuration of the semiconductor device 10 according to the present embodiment. As described above, the semiconductor memory device 10 includes 16 data input/output terminals 14. Thereby, a maximum I/O number can be set to 16 bits (DQ0 to DQ15). However, the I/O number is not fixed to 16 bits and may be set to 8 bits (DQ0 to DQ7) or 4 bits (DQ0 to DQ3). The address allocation is changed according to the I/O number and the layer address is also changed. The layer address control circuit 45 changes the address allocation according to the I/O number and is commonly connected to the core chips CC0 to CC7 through the TSVs.

The interface chip IF is also provided with a layer address setting circuit 44. The layer address setting circuit 44 is connected to the core chips CC0 to CC7 through the TSVs. The layer address setting circuit 44 is cascade-connected to the layer address generating circuit 46 of the core chips CC0 to CC7 using the TSV2 of the type shown in FIG. 2B, and reads out the layer addresses set to the core chips CC0 to CC7 at testing.

The interface chip IF is also provided with a defective chip information holding circuit 33. When a defective core chip that does not normally operates is discovered after an assembly, the defective chip information holding circuit 33 holds its chip number. The defective chip information holding circuit 33 is connected to the core chips CC0 to CC7 through the TSVs. The defective chip information holding circuit 33 is connected to the core chips CC0 to CC7 while being shifted, using the TSV3 of the type shown in FIG. 2C.

The interface chip IF includes a relief information holding circuit 400. The relief information holding circuit 400 holds the setting of the output selection signal and the secondary input selection signal with anti-fuse elements and the like. When a TSV is proved to be defective by the operation test performed after assembly process, a tester writes its setting signal in the relief information holding circuit 400. The setting signal set in the relief information holding circuit 400 is read out at power-on and the output selection signal and the secondary input selection signal for the output selection circuit 184 and the secondary selection circuit 188 are set.

The above description is the outline of the connection relationship between the external terminals and the interface chip IF and the circuit configuration of the interface chip IF. Next, the circuit configuration of the core chips CC0 to CC7 will be described.

As shown in FIG. 10, memory cell arrays 50 that are included in the core chips CC0 to CC7 performing the back end function are divided into eight banks. A bank is a unit that can individually receive a command. That is, the individual banks can be independently and nonexclusively controlled. From the outside of the semiconductor memory device 10, each back can be independently accessed. For example, a part of the memory cell array 50 belonging to the bank 1 and another part of the memory cell array 50 belonging to the bank 2 are controlled nonexclusively. That is, word lines WL and bit lines BL corresponding to each banks respectively are independently accessed at same period by different commands one another. For example, while the bank 1 is maintained to be active (the word lines and the bit lines are controlled to be active), the bank 2 can be controlled to be active. However, the external terminals (for example, plural control terminals and plural I/O terminals) of the semiconductor memory device 10 are shared. In the memory cell array 50, the plural word lines WL and the plural bit lines BL intersect each other, and memory cells MC are disposed at intersections thereof (in FIG. 4, only one word line WL, one bit line BL, and one memory cell MC are shown). The word line WL is selected by a row decoder 51. The bit line BL is connected to a corresponding sense amplifier SA in a sense circuit 53. The sense amplifier SA is selected by a column decoder 52.

The row decoder 51 is controlled by a row address supplied from a row control circuit 61. The row control circuit 61 includes an address buffer 61$a$ that receives a row address supplied from the interface chip IF through the TSV, and the row address that is buffered by the address buffer 61$a$ is supplied to the row decoder 51. The address signal that is supplied through the TSV is supplied to the row control circuit 61 through the input buffer B1. The row control circuit 61 also includes a refresh counter 61$b$. When a refresh signal is issued by a control logic circuit 63, a row address that is indicated by the refresh counter 61$b$ is supplied to the row decoder 51.

The column decoder 52 is controlled by a column address supplied from a column control circuit 62. The column control circuit 62 includes an address buffer 62$a$ that receives the column address supplied from the interface chip IF through the TSV, and the column address that is buffered by the address buffer 62$a$ is supplied to the column decoder 52. The column control circuit 62 also includes a burst counter 62$b$ that counts the burst length.

The sense amplifier SA selected by the column decoder 52 is connected to the data control circuit 54 through some amplifiers (sub-amplifiers or data amplifiers or the like) which are not shown in the drawings. Thereby, read data of 8 bits (=pre-fetch number) for each I/O (DQ) is output from the data control circuit 54 at reading, and write data of 8 bits is input to the data control circuit 54 at writing. The data control circuit 54 and the interface chip IF are connected in parallel through the TSV.

The control logic circuit 63 receives an internal command ICMD supplied from the interface chip IF through the TSV and controls the row control circuit 61 and the column control circuit 62, based on the internal command ICMD. The control logic circuit 63 is connected to a layer address comparing circuit (chip information comparing circuit) 47. The layer address comparing circuit 47 detects whether the corresponding core chip is target of access, and the detection is performed by comparing a SEL (chip selection information) which is a part of the address signal supplied from the interface chip IF through the TSV and a layer address LID (chip identification information) set to the layer address generating circuit 46. When these are matched, matching signal HIT is activated.

In the layer address generating circuit 46, unique layer addresses are set to the core chips CC0 to CC7, respectively, at initialization. A method of setting the layer addresses is as follows. First, after the semiconductor memory device 10 is initialized, a minimum value (0, 0, 0) as an initial value is set to the layer address generating circuits 46 of the core chips CC0 to CC7. The layer address generating circuits 46 of the core chips CC0 to CC7 are cascade-connected using the TSVs of the type shown in FIG. 2B, and have increment circuits provided therein. The layer address (0, 0, 0) that is set to the layer address generating circuit 46 of the core chip CC0 of the uppermost layer is transmitted to the layer address generating circuit 46 of the second core chip CC1 through the TSV and is incremented. As a result, a different layer address (0, 0, 1) is generated. Hereinafter, in the same way as the above case, the generated layer addresses are transmitted to the core chips of the lower layers and the layer address generating circuits 46 in the core chips increment the transmitted layer addresses. A maximum value (1, 1, 1) as a layer address is set to the layer address generating circuit 46 of the core chip CC7 of the lowermost layer. Thereby, the unique layer addresses are set to the core chips CC0 to CC7, respectively.

The layer address generating circuit 46 is provided with a defective chip signal DEF supplied from the defective chip information holding circuit 33 of the interface chip IF, through the TSV. As the defective chip signal DEF is supplied to the individual core chips CC0 to CC7 using the TSV3 of the type shown in FIG. 2C, the defective chip signals DEF can be supplied to the core chips CC0 to CC7, individually. The defective chip signal DEF is activated when the corresponding core chip is a defective chip. When the defective chip signal DEF is activated, the layer address generating circuit 46 transmits, to the core chip of the lower layer, a non-incremented layer address, not an incremented layer address. The defective chip signal DEF is also supplied to the control logic circuit 63. When the defective chip signal DEF is activated, the control logic circuit 63 is completely halted. Thereby, the defective core chip performs neither read operation nor write operation, even though an address signal or a command signal is input from the interface chip IF.

An output of the control logic circuit 63 is also supplied to a mode register 64. When an output of the control logic circuit 63 shows a mode register set, the mode register 64 is updated by an address signal. Thereby, operation modes of the core chips CC0 to CC7 are set.

Each of the core chips CC0 to CC7 has an internal voltage generating circuit 70. The internal voltage generating circuit 70 is provided with power supply potentials VDD and VSS. The internal voltage generating circuit 70 receives these power supply potentials and generates various internal voltages. As the internal voltages that are generated by the internal voltage generating circuit 70, an internal voltage VPERI (≈VDD) for operation power of various peripheral circuits, an internal voltage VARY (<VDD) for an array voltage of the memory cell array 50, and an internal voltage VPP (>VDD) for an activation potential of the word line WL are included. In each of the core chips CC0 to CC7, a power-on detecting circuit 71 is also provided. When the supply of power is detected, the power-on detecting circuit 71 resets various internal circuits.

The peripheral circuits in the core chips CC0 to CC7 operates in synchronization with the internal clock signal ICLK that is supplied form the interface chip IF through the TSV. The internal clock signal ICLK supplied through the TSV is supplied to the various peripheral circuits through the input buffer B2.

The above description is the basic circuit configuration of the core chips CC0 to CC7. In the core chips CC0 to CC7, the front end unit for an interface with the external device is not provided. Therefore the core chip cannot operate as a single chip in principle. However, if the core chip never operates as the single chip, an operation test of the core chip in a wafer state may not be performed. This means that the semiconductor memory device 10 cannot be tested, before the interface chip and the plural core chips are fully assembled. In other words, the individual core chips are tested when testing the semiconductor memory device 10. When unrecoverable defect exists in the core chips, the entire semiconductor memory device 10 is led to be unavailable. In this embodiment, in the core chips CC0 to CC7, a portion of a pseudo front end unit, for testing, that includes some test pads TP and a test front end unit of a test command decoder 65 is provided, and an address signal and test data or a command signal can be input from the test pads TP. It is noted that the test front end unit is provided for a simple test in a wafer test, and does not have all of the front end functions in the interface chip. For example, since an operation frequency of the core chips is lower than an operation frequency of the front end unit, the test front end unit can be simply realized with a circuit that performs a test with a low frequency.

Kinds of the test pads TP are almost the same as those of the external terminals provided in the interposer IP. Specifically, the test pads include a test pad TP1 to which a clock signal is input, a test pad TP2 to which an address signal is input, a test pad TP3 to which a command signal is input, a test pad TP4 for input/output test data, a test pad TP5 for input/output a data strobe signal, and a test pad TP6 for a power supply potential.

A common external command (not decoded) is input at testing. Therefore, the test command decoder 65 is also provided in each of the core chips CC0 to CC7. Because serial test data is input and output at testing, a test input/output circuit 55 is also provided in each of the core chips CC0 to CC7.

This is the entire configuration of the semiconductor memory device 10. Because in the semiconductor memory device 10, the 8 core chips of 1 Gb are laminated, the semiconductor memory device 10 has a memory capacity of 8 Gb in total. Because the chip selection signal /CS is input to one terminal (chip selection terminal), the semiconductor memory device is recognized as a single DRAM having the memory capacity of 8 Gb, in view of the controller.

In the semiconductor memory device 10 having the configuration described above, a setting signal held in the relief information holding circuit 400 is read out when the power is turned on, and the read setting signal is transmitted to the secondary selection circuit 188 and the output selection circuit 184 in the interface chip IF and the core chips CC0 to CC7. Further, as explained above, in the interface chip IF and the core chips CC0 to CC7, the defective through silicon via is not simply replaced by the auxiliary through silicon via; however, the defective through silicon via is bypassed by shifting the connection relation. Therefore, a difference in the wiring lengths almost does not occur between signal paths before and after replacement of the through silicon vias. Thus, because almost no skew is generated, the signal quality can be enhanced.

One among three components, that is, two through silicon vias 30 and the test pad, is selected at the input terminal of the receiver circuit. This configuration is advantageous in enhancing the signal quality, because even in this configuration only one inverter is arranged in a path that connects the through silicon via to the receiver circuit.

While the present invention has been described by several embodiments, it should be understood by persons skilled in the art that these embodiments are only exemplary, various modifications and changes can be made without departing from the scope of the claims of the present invention, and these modifications and changes are also within the scope of the claims. Therefore, descriptions in this specification and the drawings are intended to be illustrative and not restrictive.

For example, in the above embodiments, a case of supplying data from the interface chip IF to the core chips CC0 to CC7 has been explained as an example; however, in reverse, the same holds true when supplying data from the core chips CC0 to CC7 to the interface chip IF. That is, it is permissible to provide the driver circuit on the core chips CC0 to CC7 side and to provide the receiver circuit on the interface chip IF side. Because the write data supplied from the interface chip IF to the core chips CC0 to CC7 and the read data supplied from the core chips CC0 to CC7 to the interface chip IF are transmitted via the same through silicon vias, for such through silicon vias, both the driver circuit and the receiver circuit are provided in each of the interface chip IF and the core chips CC0 to CC7.

For example, in the above embodiments, a chip-stacked DRAM has been explained as an example. However, in the present invention, the type of semiconductor chips to be stacked is not particularly limited thereto. It can be other memory devices such as an SRAM, a PRAM, an MRAM, an RRAM, and a flash memory, or can be a logical system device such as a CPU and a DSP.

What is claimed is:

1. A semiconductor device comprising:
a first semiconductor chip that includes a driver circuit;
a second semiconductor chip that includes a receiver circuit and an external terminal; and
a plurality of through silicon vias that connect the first semiconductor chip and the second semiconductor chip, wherein
the first semiconductor chip further includes an output switching circuit that selectively connects the driver circuit to any one of the through silicon vias,
the second semiconductor chip further includes an input switching circuit that selectively connects the receiver circuit to anyone of the through silicon vias and the external terminal,
the input switching circuit includes tri-state inverters each inserted between the receiver circuit and an associated one of the through silicon vias and the external terminal, and
the input switching circuit activates any one of the tri-state inverters.

2. The semiconductor device as claimed in claim 1, wherein
the input switching circuit includes a primary selection circuit that activates a first tri-state inverter that is inserted between the external terminal and the receiver circuit, and a secondary selection circuit that activates one of second tri-state inverters each of which is inserted between an associated one of the through silicon vias and the receiver circuit, and
the secondary selection circuit inactivates all of the second tri-state inverters when the primary selection circuit activates the first tri-state inverter.

3. The semiconductor device as claimed in claim 1, wherein
the first semiconductor chip includes 1st to $n^{th}$ driver circuits,
the second semiconductor chip includes 1st to $n^{th}$ receiver circuits,
the plurality of through silicon vias includes 1st to $n+m^{th}$ through silicon vias,
the output switching circuit selectively connects each of the 1st to $n^{th}$ driver circuits to different ones of the 1st to $n+m^{th}$ through silicon vias by connecting an output terminal of an $i^{th}$ driver circuit to one of $i^{th}$ to $i+m^{th}$ through silicon vias, where i is an integer among 1 to n, and the input switching circuit selectively connects each of the 1st to $n^{th}$ receiver circuits to different ones of the 1st to $n+m^{th}$ through silicon vias by connecting an input terminal of an $i^{th}$ receiver circuit to one of $i^{th}$ to $i+m^{th}$ through silicon vias.

4. The semiconductor device as claimed in claim 2, wherein the secondary selection circuit activates any one of the second tri-state inverters based on a selection signal when the primary selection circuit inactivates the first tri-state inverter.

5. The semiconductor device as claimed in claim 3, wherein at least one of the through silicon vias that is connected to neither the driver circuit nor the receiver circuit is defective.

6. The semiconductor device as claimed in claim 3, wherein the first semiconductor chip and a plurality of the second semiconductor chips are laminated, and the through silicon vias are arranged on the second semiconductor chips.

7. The semiconductor device as claimed in claim 3, wherein a plurality of the first semiconductor chips and the second semiconductor chip are laminated, and the through silicon vias are arranged on the first semiconductor chips.

8. The semiconductor device as claimed in claim 1, wherein one of the first and second semiconductor chips is an interface chip and the other is a core chip.

9. The semiconductor device as claimed in claim 6, wherein the through silicon vias assigned a same number that are arranged on the second semiconductor chips are all short-circuited.

10. The semiconductor device as claimed in claim 7, wherein the through silicon vias assigned a same number that are arranged on the first semiconductor chips are all short-circuited.

11. The semiconductor device as claimed in claim 9, wherein a connection relation between the driver circuits and the through silicon vias and a connection relation between the receiver circuits and the through silicon vias are same in the second semiconductor chips.

12. The semiconductor device as claimed in claim 10, wherein a connection relation between the driver circuits and the through silicon vias and a connection relation between the receiver circuits and the through silicon vias are same in the first semiconductor chips.

13. A semiconductor chip comprising:
a first through silicon via penetrating a silicon layer of the semiconductor chip;
a first input buffer coupled between the first through silicon via and a common node;
a second through silicon via penetrating a silicon layer of the semiconductor chip;
a second input buffer coupled between the second through silicon via and the common node;
a receiver circuit coupled between the common node and an output node;
a test pad differing to the first and second through silicon vias;
a third input buffer coupled between the test pad and the common node; and
a selection circuit coupled to the first, second and third input buffers so as to exclusively activate the first, second and third input buffers.

14. The semiconductor chip in accordance with claim 13, wherein the selection circuit includes a first selection circuit to exclusively activate the first and second input buffers and the third input buffer, and a second selection circuit to exclusively activate the first input buffer and the second input buffer.

15. The semiconductor chip in accordance with claim 13, wherein the test pad receives a test signal at a wafer test.

16. The semiconductor chip in accordance with claim 13, wherein each of the first, second and third input buffers includes a tri-state buffer.

17. The semiconductor chip in accordance with claim 13, wherein
the first input buffer includes
a first transistor coupled between a first power supply line and a first node,
a second transistor coupled between a first node and the common node, and a control node of the second transistor coupled to the first through silicon via,
a third transistor coupled between the common node and a second node, and a control node of the third transistor coupled to the first through silicon via, and
a fourth transistor coupled between the second node and a second power supply line,
the second input buffer includes
a fifth transistor coupled between the first power supply line and a third node,
a sixth transistor coupled between the third node and the common node, and a control node of the sixth transistor coupled to the second through silicon via,
a seventh transistor coupled between the common node and a fourth node, and a control node of the seventh transistor coupled to the second though silicon via, and
an eighth transistor coupled between the fourth node and the second power supply line,
the third input buffer includes
a ninth transistor coupled between the first power supply line and a fifth node,
a tenth transistor coupled between the fifth node and the common node, and a control node of the tenth transistor coupled to the test pad,
an eleventh transistor coupled between the common node and a sixth node, and a control node of the eleventh transistor couple to the test pad, and
a twelfth transistor coupled between the sixth node and the second power supply line.

18. The semiconductor chip in accordance with the claim 17, further comprising an inverter circuit coupled between the third input buffer and the common node.

* * * * *